United States Patent [19]
Liu

[11] Patent Number: 5,962,906
[45] Date of Patent: Oct. 5, 1999

[54] STRUCTURE OF A COLOR SENSOR OF A DIODE

[75] Inventor: Chih-Chiang Liu, Hsinchu, Taiwan

[73] Assignee: United Microelectronics Corp., Hsinchu, Taiwan

[21] Appl. No.: 09/074,368

[22] Filed: May 8, 1998

[30] Foreign Application Priority Data

Mar. 19, 1998 [TW] Taiwan ................................. 87104078

[51] Int. Cl.$^6$ .................................................. H01L 29/34
[52] U.S. Cl. .......................... 257/432; 257/435; 257/440; 257/233
[58] Field of Search .................................. 257/440, 231, 257/232, 233, 435, 432, 442

[56] References Cited

U.S. PATENT DOCUMENTS 4,654,536  3/1987  Saito et al. ............................... 257/440
5,229,595  7/1993  Mikkelsen, Jr. et al. ................ 257/440
5,479,049  12/1995  Aoki et al. ............................... 257/440

FOREIGN PATENT DOCUMENTS 3-280575  12/1991  Japan ..................................... 257/440
5-226624  9/1993  Japan ..................................... 257/233

*Primary Examiner*—Donald L. Monin, Jr.
*Attorney, Agent, or Firm*—Oblon, Spivak, McClelland, Maier & Neustadt, P.C.

[57] ABSTRACT

A structure color sensor of a diode includes following: Firstly, a color sensor layer including a number of color sensor areas is formed on a substrate for absorbing and sensing the different color light. Then, a black matrix film covered by a transparent planarization film is on the color sensor layer by using dispersed pigment method and is placed on the interfaces between color sensor areas to reduce the interference effects between monochromatic lights. Then, a color filter including at least a red filter, a green filter, and a blue filter is on this transparent planarization film. And then, a cover film is formed on the color filter for protection.

9 Claims, 2 Drawing Sheets

STRUCTURE OF A COLOR SENSOR OF A DIODE

CROSS-REFERENCE TO RELATED APPLICATION

This application claims the priority benefit of Taiwan application serial no. 87104078, filed Mar. 19, 1998, the fall disclosure of which is incorporated herein by reference.

BACKGROUND OF THE INVENTION

1. Field of the Invention

This invention relates in general to the structure and fabrication method of a diode color sensor, and more particularly to the structure of a type of Complementary Metal-Oxide-Semiconductor (CMOS) diode color sensor by using a black matrix layer.

2. Description of Related Art

CMOS diodes are usually used in the a PC Camera and digital camera. In general, the structure of a diode color sensor is that there is a color sensor layer, which includes many different color sensor areas corresponding to different colors, on the substrate. Then, this color sensor layer is covered by a color filter which is further protected by a cover film. Incident light, usually including all possible kinds of colors and incident angles, will be filtered into three types of color light, such as red light, green light and blue light, while it is filtered by the color filter. Each color light is then absorbed and sensed by the respective color sensor.

The structure of a conventional CMOS diode is shown in FIG. 1, which includes a color sensor layer 12 deposited on a substrate 10. The color sensor layer 12 includes different color sensor areas, 12a, 12b, and 12c. Then, a color filter 14 is formed on the top of the color sensor layer 12, that is, the color sensor areas 12a, 12b, and 12c. The color filter 14 protected by a cover film 16 is composed of a red filter R1, a green filter G1 and a blue filter B1 corresponding to color sensor areas 12a, 12b, and 12c, respectively. The incident light, usually including all possible kinds of colors and incident angles, will be filtered into three types of color light, such as red light, green light and blue light, while it is filtered by the color filter. Each color light is then absorbed and sensed by the respective color sensor.

The conventional diode color sensor as described above has a lot of problems as follows:

1. When the incident light is filtered through the color filter, because of the scattering effects occurring at color filters. Color quality of each monochromatic light is deteriorated.
2. Because the present technique on the CMOS diode has achieved a level of high resolution of pixels with an order of million, a pixel size is as small as 5 $\mu$m causing the light excited rate being decreased and a planarization film being needed either, these result in the more requirement of the light receiving performance for the monochromatic light of red, green and blue.
3. Conventionally, the color sensor layer has no effective light shielding means. Typically existing metal lines on the wafer are used as a means for light shielding. However, this kind of light shielding means is ineffective due to its position being not located right above the color sensor layer and its large scale of light shielding and more that the cost is tremendously increased due to extra process steps and photo-mask being required.

SUMMARY OF THE INVENTION

It is therefore an objective of the present invention to provide a structure of a CMOS diode color sensor, using black matrix film placed on the color sensor layer. The black matrix, a more effective light shielding means, therefore, avoids the scattering effect and enhances the color quality of monochromatic light.

In accordance with the foregoing and other objectives of the present invention, this invention discloses a structure of a CMOS diode color sensor which includes a substrate on which there is a color sensor layer carrying a plurality of color sensor areas for absorbing and sensing the different color light; then a black matrix film is formed on the color sensor layer; then a transparent planarization layer is formed on the black matrix film; then a color filter is formed on the transparent planarization layer including at least a red filter area, a green filter area, and a blue filter area; and then a cover film for protection is formed on the color filter layer.

Moreover, to achieve the objective in accordance with the foregoing and other objectives of the present invention, this invention discloses a fabrication of a CMOS diode color in the following: at first, a substrate is provided; then a color sensor layer including a plurality of color sensor areas is formed on this substrate for absorbing and sensing different colors of light; then a black matrix film is formed on this color sensor layer by using the fabrication method of dispersed pigment and is located on the interfaces between these color sensor areas to reduce the interference between monochromatic lights; then a transparently planarization layer is formed on this black matrix film; and then a color filter carrying at least a red filter area, a green filter area, and a blue filter area is formed on this transparently planarization layer which is covered by a cover film for protection.

DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
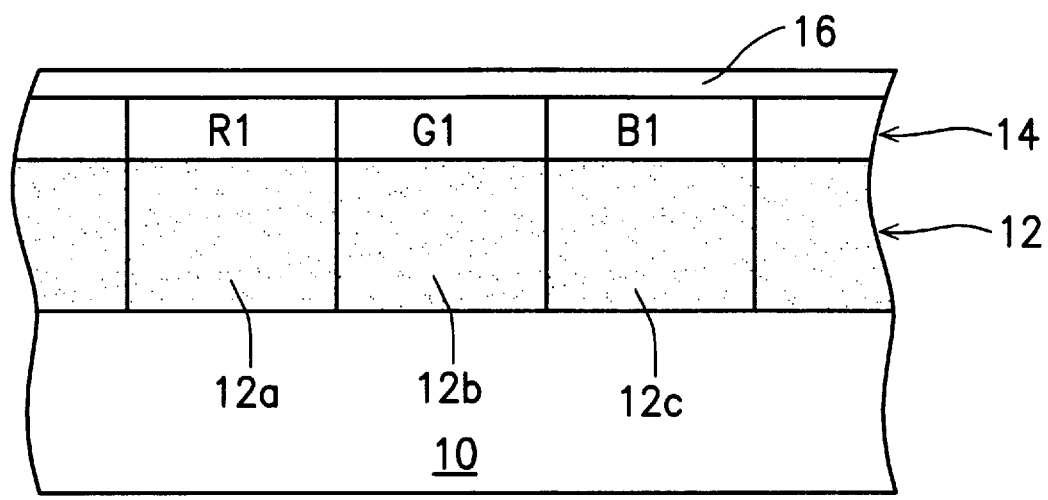
FIG. 1 is a sectional view of a conventional color sensor of a CMOS diode.
Figure 2A:
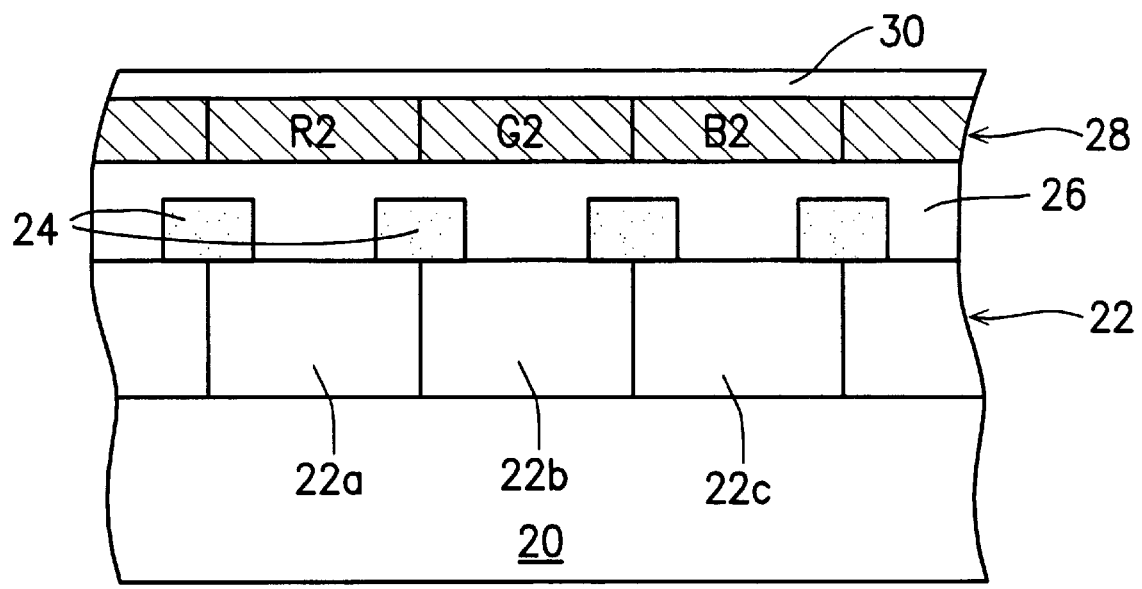
FIG. 2A is a sectional view of a color sensor of a CMOS diode according to a preferred embodiment of this invention.

Preferred embodiments of the present invention provide the structure of a CMOS diode color sensor as shown in FIG. 2A. A color sensor layer 22, which includes a number of color sensor areas for absorbing different color light, such as a color sensor 22a, a color sensor area 22b and a color sensor area 22c. All of 22a, 22b and 22c are formed on a substrate 20. Then, a black matrix film 24 preferably made of a kind of opaquely black pigment is formed over this color sensor layer 22, that is, over the color sensor areas 22a, 22b, and 22c. The black matrix film 24 is preferably formed by dispersed pigment method. It is characterized in this invention that this black matrix film 24 is preferably taken to be located around the interfaces between those color sensor areas 22a, 22b, and 22c and has a shape of matrix grid as viewed from the top so that the rectangular voids are matched to the color sensor areas leaving unshielded and therefore the interference between monochromatic lights is reduced. Then, a transparent planarization film 26 made of acrylic material is formed on a black matrix film 24. Then a color filter 28 is formed on this transparent planarization film 26 having a red filter R2, a green filter G2, and blue filter B2 by a way of, for example, electrolysis method, dye Method or dispersion pigment method. And then, a cover film 30 is formed on the top for the protection. In general, the incident light onto a diode color sensor includes different color light with different incident angles. This black matrix film 24 can reduce the interference between these monochromatic lights. When the incident light is filtered through the color filter 28 it will be filtered into red, green and blue light by color filters R2, G2, and B2 respectively and then will be absorbed and sensed by color sensor areas 22a, 22b, and 22c, respectively.

Figure 2B:
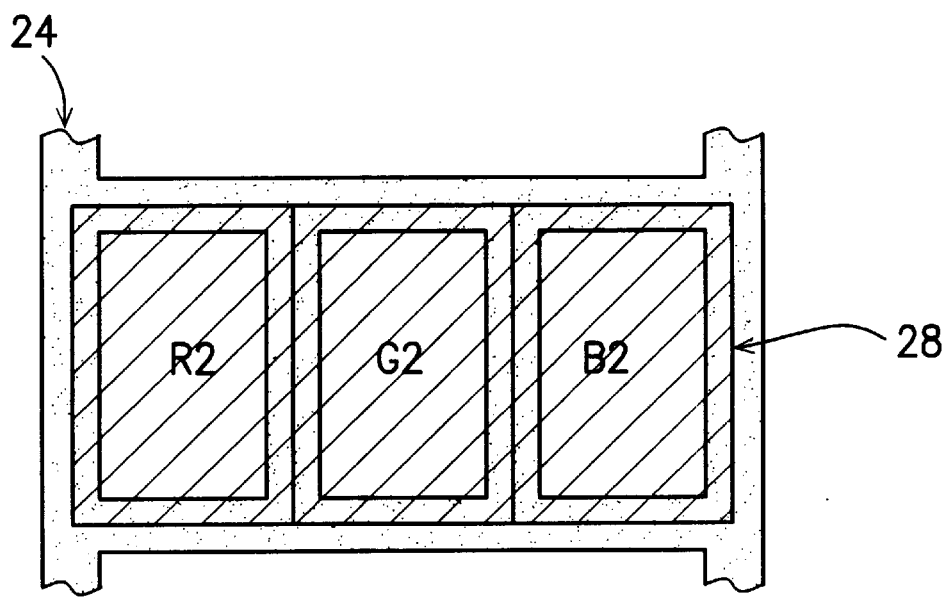
FIG. 2B is a top view of the color sensor of a CMOS diode as shown in the FIG. 2A.

Next, a top view of FIG. 2A is shown in FIG. 2B. As shown in FIG. 2B, this black matrix film 24 is placed at the color sensor layer 22 and under the color filter 28, which includes a red filter R2, a green filter G2, and a blue filter B2. As clearly seen in the FIG. 2B, the black matrix film 24 has a shape of matrix grid (dotted area) with the rectangular voids being arranged in an array of matrix matching to the color filter elements R2, G2, and B2 which are contained in the color filter, respectively.

In the conclusions of above, the preferred embodiments of the present invention provide the structure and the fabrication method of a CMOS diode color and have characteristics as follows:

1. The present invention utilizes the black matrix film 24, which avoids the interference between different color filter elements after the incident light is filtered through the color filter. Therefore the scattering effect is prevented the color quality of each monochromatic light is improved.
2. The black matrix film 24 of the present invention can be applied in the present technology of high resolution of the pixels made of CMOD diode with an order of million so that the light excited rate is increased to satisfy the requirement of the light receiving performance for the monochromatic light of red, green and blue.

The black matrix film 24 of the present invention is located right on the color sensor layer 22 with only a small portion of shielded area, and therefore efficiently shields the light. Moreover, using the black matrix film for shielding light instead of conventional metal lines reduced the process steps, a number of photo-masks and therefore cutting down the cost.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of a color sensor of a diode, comprising:
   a substrate;
   a color sensor layer on the substrate, wherein the color sensor layer comprises a plurality of color sensor areas for absorbing and sensing different color light and wherein between these color sensor areas there are a plurality of interfaces;
   a black matrix film on the color sensor layer, wherein the black matrix film has a shape of matrix grid with a plurality of rectangular voids and wherein the black matrix film covers at least these interfaces and exposes these color sensor areas;
   a transparent planarization film at least on the black matrix film;
   a color filter on the transparent planarization film, wherein the color filter comprises at least a red filter, a green filter, and a blue filter; and
   a cover film covering the color filter.

2. The structure of claim 1, wherein a material of the black matrix film comprises an opaque pigment.

3. The structure claim 1, wherein the black matrix film is formed by a dispersed pigment method.

4. The structure of claim 1, wherein each of these rectangular voids of the black matrix film is arranged above the red filter, the green filter, and the blue filter, respectively.

5. The structure of claim 1, wherein a material of the transparent planarization film comprises acrylic.

6. The structure of claim 1, wherein the color filter is formed preferably by an electrolysis method.

7. The structure of claim 1, wherein the color filter is formed preferably by a dye method.

8. The structure of claim 1, wherein the color filter is formed by a dispersion pigment method.

9. A structure of a color sensor of a diode, comprising:
   a substrate;
   a color sensor layer on the substrate, wherein the color sensor layer comprises a plurality of sensor areas for absorbing and sensing different color light and wherein between these color sensor areas there are a plurality of interfaces;
   a black matrix film including an opaque pigment on the color layer, wherein the black matrix film has a shape of matrix grid with a plurality of rectangular voids and wherein the black matrix film covers at least these interfaces and exposes these color sensor areas;
   a transparent planarization film at least on the black matrix film;
   a color filter, wherein the color filter comprises at least a red filter, a green filter, and a blue filter; and
   a cover film covering the color filter.

\* \* \* \* \*